(12) United States Patent
Sin et al.

(10) Patent No.: US 8,115,323 B2
(45) Date of Patent: Feb. 14, 2012

(54) SEMICONDUCTOR PACKAGE AND METHOD OF MANUFACTURING THE SEMICONDUCTOR PACKAGE

(75) Inventors: Wha-Su Sin, Chungcheongnam-do (KR); Heui-Seog Kim, Chungcheongnam-do (KR); Jong-Keun Jeon, Chungcheongnam-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 532 days.

(21) Appl. No.: 12/110,222

(22) Filed: Apr. 25, 2008

(65) Prior Publication Data

US 2008/0265431 A1  Oct. 30, 2008

(30) Foreign Application Priority Data

Apr. 30, 2007 (KR) .................. 10-2007-0041923

(51) Int. Cl.
*H01L 23/48* (2006.01)
*H01L 23/29* (2006.01)

(52) U.S. Cl. .. 257/784; 257/790; 257/793; 257/E23.024
(58) Field of Classification Search .................. 257/777, 257/784, 790, 793, E23.024, E23.025
See application file for complete search history.

(56) References Cited

U.S. PATENT DOCUMENTS

| 6,956,741 B2 * | 10/2005 | Su ................................ 361/704 |
| 2002/0180025 A1 * | 12/2002 | Miyata et al. ................. 257/690 |
| 2005/0040514 A1 * | 2/2005 | Lee et al. ...................... 257/701 |
| 2006/0214306 A1 * | 9/2006 | Yamazaki et al. ............. 257/777 |
| 2008/0318362 A1 * | 12/2008 | Miyazaki et al. ............. 438/113 |

FOREIGN PATENT DOCUMENTS

| KR | 2004-0089453 | 10/2004 |
| KR | 2004-0093562 | 11/2004 |
| KR | 10-0499289 | 6/2005 |

OTHER PUBLICATIONS

English language abstract of Korean Publication No. 2004-0089453, Oct. 2004.
English language abstract of Korean Publication No. 2004-0093562, Nov. 2004.
English language abstract of Korean Publication No. 10-0499289, Jun. 2005.

* cited by examiner

*Primary Examiner* — Shouxiang Hu
(74) *Attorney, Agent, or Firm* — Harness, Dickey & Pierce, P.L.C.

(57) ABSTRACT

A semiconductor package and a method of manufacturing the package are provided. The semiconductor package comprises: a mounting substrate including a bond finger; at least one semiconductor chip disposed on the mounting substrate, the semiconductor chip including a bonding pad; a first molding member disposed on the mounting substrate so as to cover the bond finger and the bonding pad, the first molding member including an interconnection path disposed inside the first molding member so as to connect the bond finger to the bonding pad; a conductive element disposed in the interconnection path; and a second molding member overlying the first molding member. The interconnection path can be formed by a laser process. The conductive element can be formed by conductive nanoparticles or metal wires.

18 Claims, 4 Drawing Sheets

SEMICONDUCTOR PACKAGE AND METHOD OF MANUFACTURING THE SEMICONDUCTOR PACKAGE

CROSS-REFERENCE TO RELATED APPLICATIONS

This application claims priority under 35 U.S.C. §119 to Korean Patent Application No. 2007-41923, filed on Apr. 30, 2007 in the Korean Intellectual Property Office (KIPO), the contents of which are herein incorporated by reference in their entirety.

BACKGROUND

1. Technical Field

Example embodiments of the present invention relate to a semiconductor package and a method of manufacturing the semiconductor package. More particularly, example embodiments of the present invention relate to a semiconductor package including a conductive element for electrically connecting a mounting substrate to semiconductor chips on the mounting substrate and a method of manufacturing the semiconductor package.

2. Description of the Related Art

Over the past several years, semiconductor packages have become smaller and lighter in response to the trend towards miniaturization of various electronic products using semiconductor devices. The packaging technique used for the semiconductor devices is an important factor in determining the size of a semiconductor module, the heat dissipation efficiency, the electrical performance, the reliability, and the price, among other things.

Generally, the semiconductor package is formed by several processes, including: a dicing process for separating a wafer provided with a plurality of semiconductor devices into individual semiconductor devices; a die bonding process for adhering the semiconductor devices to a die pad of a lead frame using an adhesive; a wire bonding process for connecting an input/output (I/O) pad of the semiconductor device and a bond finger of the lead frame with a conductive wire; a molding process for sealing thermosetting material on the semiconductor device to protect the semiconductor device from the exterior environment; a trimming process for dividing the lead frame into individual devices; and a marking process for printing a trademark and a product number on an outer surface of the semiconductor package.

A single chip package in which only one semiconductor chip is mounted in one semiconductor package has been employed in the past. Recently however, a multi-chip package in which various semiconductor chips are mounted in one semiconductor package has been commonly employed.

According to a conventional method of manufacturing a multi-chip semiconductor package, after a plurality of semiconductor chips are stacked vertically on a mounting substrate by a die bonding process, I/O pads of the semiconductor chip are connected to bond fingers of the mounting substrate with conductive wires by a wire bonding process. Then, thermosetting material is coated on the mounting substrate to cover the semiconductor chips by a molding process.

In particular, in a conventional wire bonding process, the conductive wires are connected using a bonding capillary. However, distances between the I/O pads and the bond fingers connected by the conductive wires are gradually decreasing as the semiconductor chips become smaller and more complex. Thus, as the diameter of the conductive wire is decreased and the length of the conductive wire is increased, the bonding capability of the conductive wire may be deteriorated, and a sweeping phenomenon and shorts between the conductive wires may result.

Accordingly, a new method of electrically connecting the semiconductor chip to the bond finger is required, especially when the I/O pads have a small pitch and the conductive wire is relatively thin and long.

SUMMARY

Example embodiments of the present invention provide a semiconductor package including a conductive element for electrically connecting input/output (I/O) pads with a fine pitch to a mounting substrate. Example embodiments of the present invention also provide a method of manufacturing the above-mentioned semiconductor package.

According to one aspect of the present invention, a semiconductor package includes a mounting substrate, at least one semiconductor chip, a first molding member, a conductive element and a second molding member. The mounting substrate has a bond finger. The semiconductor chip is disposed on the mounting substrate. The semiconductor chip has a bonding pad. The first molding member is formed on the mounting substrate so as to cover the bond finger and the bonding pad. The first molding member has an interconnection path that is formed in the first molding member to connect the bond finger to the bonding pad. The conductive element is provided in the interconnection path. The second molding member overlies the first molding member to cover the semiconductor chip.

BRIEF DESCRIPTION OF THE DRAWINGS

The above and other features and advantages of the present invention will become more apparent by describing in detail example embodiments thereof with reference to the accompanying drawings, in which.

DETAILED DESCRIPTION

Figure 1:
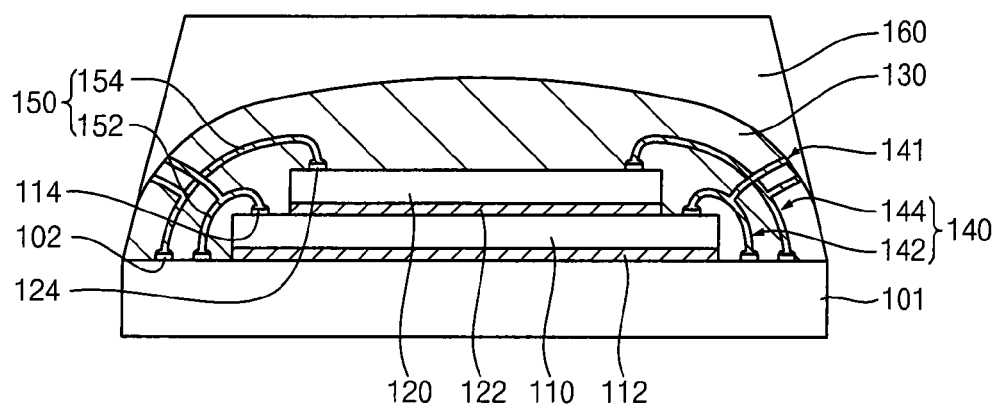
FIG. 1 is a cross-sectional view illustrating a semiconductor package in accordance with example embodiments of the present invention.

The present invention is described more fully hereinafter with reference to the accompanying drawings, in which example embodiments of the present invention are shown. The present invention may, however, be embodied in many different forms and should not be construed as limited to the example embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view illustrating a semiconductor package in accordance with example embodiments of the present invention.

Referring to FIG. 1, a semiconductor package 100 according to example embodiments of the present invention includes a mounting substrate 101, first and second semiconductor chips 110 and 120 arranged on the mounting substrate 101, a first molding member 130 formed on the mounting substrate 101 and provided with an interconnection path 140 formed in the first molding member 130, a conductive element or conductive wire 150, and a second molding member 160.

Bond fingers 102 are provided on the mounting substrate 101 so as to electrically connect the first and the second semiconductor chips 110 and 120 to the mounting substrate 101. The first semiconductor chip 110 is adhered to the mounting substrate 101 by a first adhesive layer 112. A first bonding pad 114 is provided on the first semiconductor chip 110 so as to electrically connect the first semiconductor chip 110 to the mounting substrate 101. The second semiconductor chip 120 is adhered to the first semiconductor chip 110 by a second adhesive layer 122. A second bonding pad 124 is provided on the second semiconductor chip 120 so as to electrically connect the second semiconductor chip 120 to the mounting substrate 101.

The first molding member 130 is formed on the mounting substrate 101 where the first and the second semiconductor chips 110 and 120 are formed. In one example embodiment, the first molding member 130 may be formed on an entire upper region of the first and the second semiconductor chips 110 and 120 including a region covering the bond fingers 102 of the mounting substrate 101 and the first and the second bonding pads 114 and 124. For example, the first molding member 130 may include silicon.

The interconnection path 140 is formed in the first molding member 130. The first and the second bonding pads 114 and 124 are interconnected to the bond fingers 102 through the interconnection path 140, respectively. The interconnection path 140 includes an injection portion 141 through which a conductive material is injected into the interconnection path 140.

In one example embodiment, the interconnection path 140 may include a first connection path 142 and a second connection path 144. The first bonding pad 114 of the first semiconductor chip 110 is connected to the bond finger 102 of the mounting substrate 101 through the first connection path 142. The second bonding pad 124 is connected to the bond finger 102 of the mounting substrate 101 through the second connection path 144.

For example, a laser beam having a penetrative wavelength may be irradiated inside the first molding member 130 to form the interconnection path 140. An inner portion of the first molding member 130 may absorb a condensed laser light inside the first molding member 130. Then, the inner portion of the first molding member 130 that absorbs the laser beam may be processed in a specific shape to form the interconnection path 140.

The conductive wire 150 is provided in the interconnection path 140. The conductive wire 150 may include a first conductive wire 152 and a second conductive wire 154. The first conductive wire 152 electrically connects the first bonding pad 114 of the first semiconductor chip 110 to the bond finger 102 of the mounting substrate 101. The second conductive wire 154 electrically connects the second bonding pad 124 of the second semiconductor chip 120 to the bond finger 102 of the mounting substrate 101. For example, the conductive wire 150 may include gold, aluminum, etc. These may be used alone or in a mixture thereof.

A conductive material is injected into the first molding member 130 through the injection portion 141 of the interconnection path 140 to form the conductive wire 150. For example, conductive nanoparticles may be injected into the first molding member 130 through the injection portion 141 of the interconnection path 140, and then the conductive nanoparticles may be thermally treated to form the conductive wire 150. In this case, the conductive nanoparticles within the first molding member 130 may be changed into the conductive wire 150 by thermally treating the first molding member 130.

Alternatively, a metal wire may be inserted into the injection portion 141 of the interconnection path 140. A first metal wire may be inserted into the injection portion 141 of the interconnection path 140 to make contact with the first and the second bonding pads 114 and 124 of the first and the second semiconductor chips 110 and 120. A second metal wire may be inserted into the injection portion 141 of the interconnection path 140 to make contact with the bond finger 102 of the mounting substrate 101. Then, end portions of the first and the second metal wires may be combined with each other by a heat treatment process to form the conductive wire 150.

The second molding member 160 is formed on the mounting substrate 101 so as to cover the first and the second semiconductor chips 110 and 120. For example, the second molding member 160 may include an epoxy molding compound (EMC).

Figure 2:
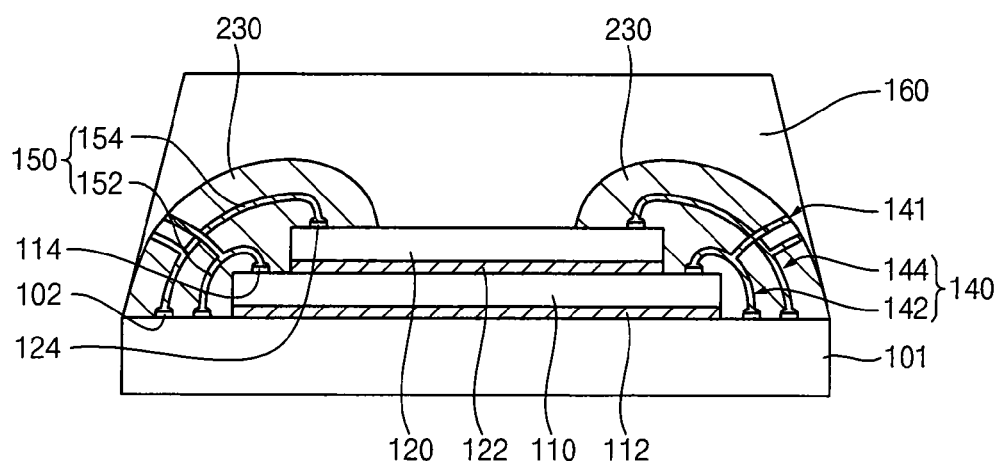
FIG. 2 is a cross-sectional view illustrating a semiconductor package in accordance with other example embodiments of the present invention.

FIG. 2 is a cross-sectional view illustrating a semiconductor package in accordance with other example embodiments of the present invention.

Semiconductor packages of the present embodiments may include the same or similar elements to those of the packages in example embodiments of FIG. 1 except for the first molding member. Thus, the same reference numerals will be used to refer to the same or like elements as those described in example embodiments of FIG. 1, and any further explanations with respect to these elements will be omitted.

Referring to FIG. 2, a semiconductor package 200 according to other example embodiments of the present invention includes a mounting substrate 101, first and second semiconductor chips 110 and 120 arranged on the mounting substrate 101, a first molding member 230 formed on the mounting substrate 101 and provided with an interconnection path 140 formed therein, a conductive wire 150, and a second molding member 160.

The first molding member 230 is formed on the mounting substrate 101 so as to cover bond fingers 102 of the mounting substrate 101, and first and second bonding pads 114 and 124. According to some embodiments, the first molding member 230 may be formed on a portion of the first and the second semiconductor chips 110 and 120. Specifically, the first molding member 230 may be formed on the portion of the first and the second semiconductor chips 110 and 120 where the first and the second bonding pads 114 and 124 are formed.

According to the present invention, the first molding members 130 and 230 formed on the mounting substrate 101 include the interconnection path 140 formed inside the first molding members 130 and 230. The conductive material may be injected into the interconnection path 140 to form the conductive wire 150. Accordingly, long and thin conductive wires spaced apart by a small distance may be formed in the first molding members 130 and 230 to manufacture the semiconductor package. Accordingly, defects due to shorts and a sweeping phenomenon between the conductive wires 150 occurring in the manufacture of the semiconductor package can be substantially reduced.

FIGS. 3 to 7 are cross-sectional views illustrating a method of manufacturing the semiconductor package of FIG. 1.

Figure 3:
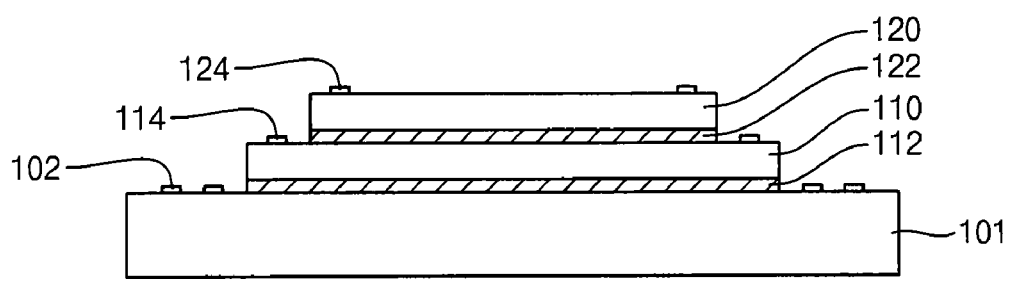
FIGS. 3 to 7 are cross-sectional views illustrating a method of manufacturing the semiconductor package of FIG. 1.

Referring to FIG. 3, at least one or more semiconductor chips 110 and 120 are arranged on a mounting substrate 101. For example, first and second semiconductor chips 110 and 120 are sequentially stacked on the mounting substrate 101.

Bond fingers 102 are formed on the mounting substrate 101 so as to electrically connect the mounting substrate 101 to the first and the second semiconductor chips 110 and 120. In one example embodiment, a solder ball pad (not illustrated) may be formed on an opposing surface of the mounting substrate 101, and the mounting substrate 101 may be a printed circuit board (PCB) including a conductive structure such as a via formed therein.

The first semiconductor chip 110 is adhered to the mounting substrate 101 by a first adhesive layer 112. A first bonding pad 114 is formed on the first semiconductor chip 110 so as to electrically connect the first semiconductor chip 110 to the mounting substrate 101. The second semiconductor chip 120 is adhered to the first semiconductor chip 110 by a second adhesive layer 122. A second bonding pad 124 is formed on the second semiconductor chip 120 so as to electrically connect the second semiconductor chip 120 to the mounting substrate 101.

In one example embodiment, the first and the second semiconductor chips 110 and 120 may be adhered by a eutectic die bonding process, a soft solder die bonding process, a tape bonding process, etc. The first and the second adhesive layers 112 and 122 may include epoxy, polyimide, etc.

Figure 4:
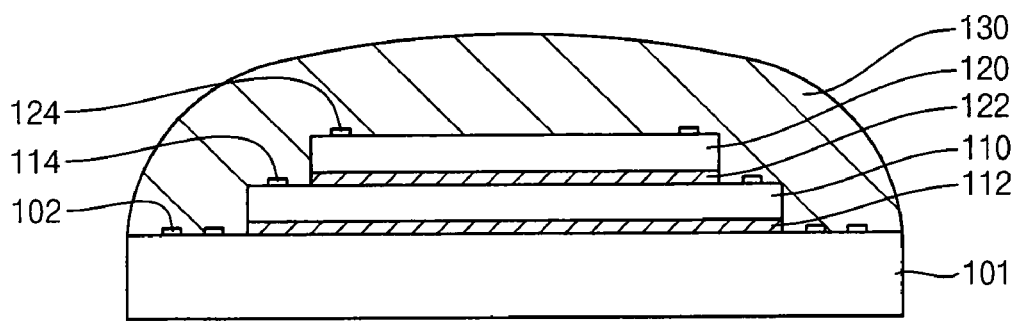

Referring to FIG. 4, a first molding member 130 is formed on the mounting substrate 101 so as to cover the first and the second semiconductor chips 110 and 120. For example, the first molding member 130 may be formed using material that a laser can penetrate. Energy from the laser condensed and penetrated into the first molding member 130 may be absorbed inside the first molding member 130, and then, the inner portion of the first molding member 130 that absorbs the energy may be processed into a specific shape by a laser processing method.

In one example embodiment, a semisolid material including silicon may be coated on the mounting substrate 101 to form the first molding member 130. Alternatively, the first molding member 130 may be formed using an EMC.

Because a conductive wire 150 (see FIG. 6) for electrically connecting the first and the second semiconductor chips 110 and 120 to the mounting substrate 101 is formed inside the first molding member 130, the first molding member 130 may be coated so as to have a predetermined height from a surface of the mounting substrate 101 such that the conductive wire 150 is formed inside the first molding member 130.

In one example embodiment, the first molding member 130 may be formed on an entire upper region of the mounting substrate 101. In another example embodiment, the first molding member 130 may formed on a portion of the mounting substrate 101 to cover only the bond fingers 102 of the mounting substrate 101 and the first and the second bonding pads 114 and 124 of the first and the second semiconductor chips 110 and 120.

Figure 5:
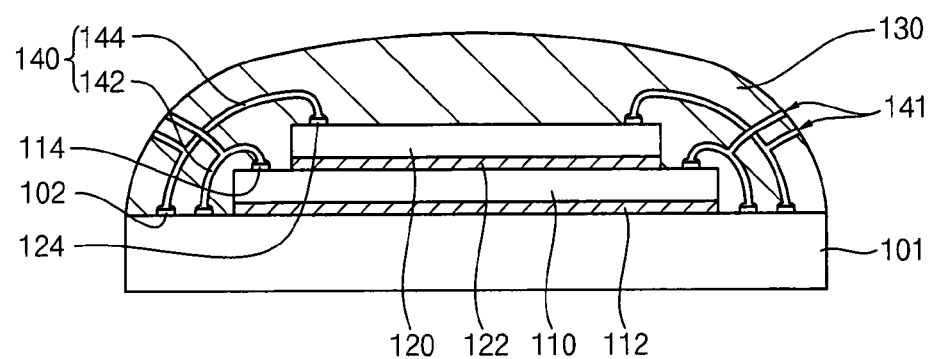

Referring to FIG. 5, the first molding member 130 is processed so as to form an interconnection path 140 for interconnection between the semiconductor chips 110 and 120 and the mounting substrate 101.

In one example embodiment, a laser beam having a penetrating wavelength may be irradiated inside the first molding member 130 to form the interconnection path 140. The interconnection path 140 may include an injection portion 141 through which a conductive material is injected into the interconnection path 140.

First, a laser processing apparatus (not illustrated) is positioned over the first molding member 130. The laser processing apparatus may include a laser light source, a laser light source controller for controlling power or pulse width of the laser light, a mirror for reflecting the laser light, a condenser lens for condensing a reflected laser light and a stage for supporting and moving the first molding member 130.

The laser light generated from the laser light source is condensed and irradiated inside the first molding member 130 along a predetermined route. The first molding member 130 absorbs the condensed laser light at a predetermined depth from an outer surface of the first molding member 130. A portion of the first molding member 130 that absorbs the laser light is processed in a specific shape to form the interconnection path 140. Additionally, the interconnection path 140 may be processed to have the injection portion 141 through which a conductive material is injected from the outside.

In one example embodiment, the interconnection path 140 may include a first connection path 142 and a second connection path 144. The first bonding pad 114 of the first semiconductor chip 110 is connected to the bond finger 102 of the mounting substrate 101 through the first connection path 142. The second bonding pad 124 is connected to the bond finger 102 of the mounting substrate 101 through the second connection path 144.

Thus, the interconnection path 140 may be processed to have a small size by the laser processing so as to connect the mounting substrate 101 and the first and the second semiconductor chips 110 and 120. In addition, the interconnection path 140 may be formed so as to be spaced apart by a small distance inside the first molding member 130. In other words, adjacent ones of the interconnection paths 140 inside the first molding member 130 may be spaced close together. Further, the first and second connection paths 142 and 144 may be spaced close together.

Figure 6:
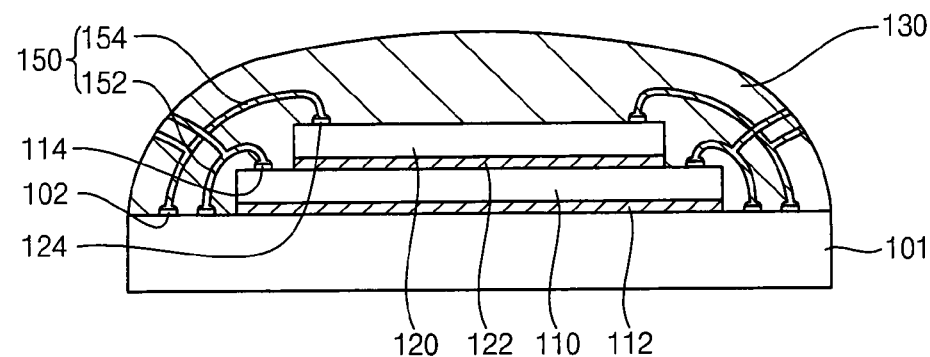

Referring to FIG. 6, a conductive material is injected into the interconnection path 140 so as to form a conductive wire 150 that electrically connects the semiconductor chips 110 and 120 to the mounting substrate 101.

In one example embodiment, conductive nanoparticles may be injected into the first molding member 130 through the injection portion 141 of the interconnection path 140, and then the conductive nanoparticles may be thermally treated to form the conductive wire 150. In this case, the conductive nanoparticles within the first molding member 130 may be changed into the conductive wire 150 by thermally treating the first molding member 130.

In another example embodiment, a metal wire may be inserted into the injection portion 141 of the interconnection path 140. A first metal wire may be inserted into the injection portion 141 of the interconnection path 140 so as to make contact with the first and the second bonding pads 114 and 124 of the first and the second semiconductor chips 110 and 120. A second metal wire may be inserted into the injection portion 141 of the interconnection path 140 so as to make contact with the bond finger 102 of the mounting substrate 101. Then, end portions of the first and the second metal wires may be combined by a heat treatment process to form the conductive wire 150.

In still another example embodiment, after a conductive material is injected into the interconnection path, a laser light may be irradiated again into the conductive material, and then, the conductive material may be processed by the laser processing to form the conductive wire 150.

In one example embodiment, the conductive wire 150 may include a first conductive wire 152 and a second conductive wire 154. The first conductive wire 152 electrically connects the first bonding pad 114 of the first semiconductor chip 110 to the bond finger 102 of the mounting substrate 110. The second conductive wire 152 electrically connects the second bonding pad 124 of the second semiconductor chip 120 to the bond finger 102 of the mounting substrate 101.

Thus, although the bonding pads and bond fingers are spaced apart by a minute distance, the conductive wire 150 may be formed to have a small diameter such that the bonding pads are electrically connected to the bond fingers by the conductive wires 150 without defects due to shorts and a sweeping phenomenon occurring between the conductive wires 150.

Figure 7:
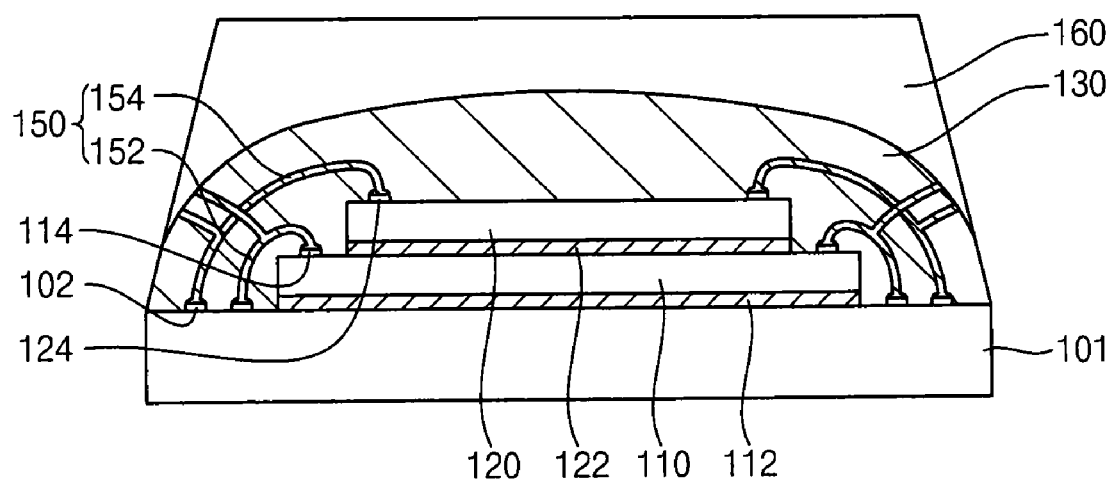

Referring to FIG. 7, a second molding member 160 is formed on the mounting substrate 101 to protect the first and the second semiconductor ships 110 and 120 from external impacts. For example, the second molding member 160 may be formed using an EMC. The second molding member 160 may be formed by a molding process.

The second molding member 160 may protect the first and the second semiconductor chips 110 and 120 from various causes of electrical deterioration such as corrosion due to air or atmosphere and may provide mechanical stability of the semiconductor package.

Finally, a trimming process for dividing the mounting substrate 101 into individual devices and a marking process for printing a trademark and a product number on an outer surface thereof may be performed to complete the semiconductor package.

As mentioned above, in a method of manufacturing a semiconductor package according to example embodiments of the present invention, after a molding member is formed on the mounting substrate to cover one or more semiconductor chips on the mounting substrate, an inner portion of the molding member is processed by a laser having a penetrating wavelength to form an interconnection path. Then, a conductive material is injected into the interconnection path to form a conductive wire.

Accordingly, the above-mentioned long and thin conductive wires may be formed so as to be spaced apart by a small distance inside the molding member. Accordingly, the conductive wires electrically connect the semiconductor chips to the mounting substrate without defects due to shorts and a sweeping phenomenon occurring between the conductive wires.

According to one aspect of the present invention, a semiconductor package includes a mounting substrate, at least one semiconductor chip, a first molding member, a conductive element and a second molding member. The mounting substrate has a bond finger. The semiconductor chip is disposed on the mounting substrate. The semiconductor chip has a bonding pad. The first molding member is formed on the mounting substrate so as to cover the bond finger and the bonding pad. The first molding member has an interconnection path that is formed in the first molding member so as to connect the bond finger to the bonding pad. The conductive wire is provided in the interconnection path. The second molding member is formed on the mounting substrate so as to cover the semiconductor chip.

In one example embodiment, the interconnection path may include an injection portion through which a conductive material is injected from the outside of the first molding member.

According to another aspect of the present invention, there is provided a method of manufacturing a semiconductor package. In the method of manufacturing a semiconductor package, at least one semiconductor chip is arranged on a mounting substrate. A first molding member is formed on the mounting substrate to cover the semiconductor chip. An interconnection path is formed within the first molding member. The interconnection path connects the semiconductor chip to the mounting substrate. A conductive material is injected into the interconnection path to form a conductive wire that electrically connects the semiconductor chip to the mounting substrate. A second molding member is formed on the mounting substrate to protect the semiconductor chip from external impacts.

In one example embodiment, forming the first molding member on the mounting substrate may include coating a semisolid material on the mounting substrate. The first molding member may include silicon.

In one example embodiment, forming the interconnection path may include irradiating a laser beam having a penetrative wavelength into the first molding member to form the interconnection path. The interconnection path may include an injection portion through which a conductive material is injected from the outside of the first molding member.

In one example embodiment, forming the conductive wire may include injecting conductive nanoparticles into the interconnection path and thermally heating the conductive nanoparticles to form the conductive wire.

In another example embodiment, the conductive material may include a metal wire.

In one example embodiment, the second molding member may be formed by using an epoxy molding compound (EMC). The semiconductor chip may be mounted on the mounting substrate by a die mounting process.

According to the present invention, after a molding member is formed on the mounting substrate to cover one or more semiconductor chips on the mounting substrate, an inner portion of the molding member is processed by laser processing using a laser having a penetrating wavelength to the molding member to form an interconnection path. Then, a conductive material is injected into the interconnection path to form a conductive wire.

Accordingly, the above-mentioned long or thin conductive wires may be formed so as to be spaced apart by a small distance in the molding member such that the conductive wires electrically connect the semiconductor chips to the mounting substrate without defects due to shorts and a sweeping phenomenon occurring between the conductive wires.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A semiconductor package comprising:
   a mounting substrate including a bond finger;
   at least one semiconductor chip on the mounting substrate, the semiconductor chip including a bonding pad;
   a first molding member covering the bond finger and the bonding pad, the first molding member including an interconnection path inside the first molding member to connect the bond finger to the bonding pad; and
   a conductive wire in the interconnection path,
   wherein the interconnection path includes an injection portion through which a conductive material is injected from outside of the first molding member to form the conductive wire.

2. The semiconductor package of claim 1, wherein the first molding member comprises silicon.

3. The semiconductor package of claim 1, further comprising:
   a second molding member overlying the first molding member.

4. The semiconductor package of claim 1, wherein the conductive element comprises one selected from the group consisting of gold, aluminum and a mixture thereof.

5. The semiconductor package of claim 1, wherein the conductive element comprises thermally treated conductive nanoparticles.

6. The semiconductor package of claim 3, wherein the second molding member comprises an epoxy molding compound (EMC).

7. A semiconductor package, comprising:
   a mounting substrate including at least one bond finger;
   a first semiconductor chip on the mounting substrate, the first semiconductor chip including a first bonding pad;
   a first molding member on at least a portion of the first semiconductor chip, the first molding member including at least one interconnection path inside the first molding member;
   a conductive wire in the interconnection path; and
   a second molding member on at least a portion of the first molding member,
   wherein the interconnection path includes an injection portion through which a conductive material is injected from outside of the first molding member to form the conductive wire.

8. The semiconductor package of claim 7, further comprising:
   a second semiconductor chip on the first semiconductor chip, the second semiconductor chip including a second bonding pad, wherein the first molding member is on a first portion of the second semiconductor chip.

9. The semiconductor package of claim 8, wherein the first portion of the second semiconductor chip includes the second bonding pad.

10. The semiconductor package of claim 9, wherein the second molding member is on a second portion of the second semiconductor chip.

11. The semiconductor package of claim 10, wherein the second molding member directly contacts the second portion of the second semiconductor chip.

12. The semiconductor package of claim 8, further comprising:
- a first adhesive layer between the mounting substrate and the first semiconductor chip; and
- a second adhesive layer between the first semiconductor chip and the second semiconductor chip.

13. The semiconductor package of claim 8, wherein the interconnection path comprises:
- a first interconnection path connecting the first bonding pad to at least one of the bond fingers; and
- a second interconnection path connecting the second bonding pad to at least one of the bond fingers.

14. The semiconductor package of claim 13, wherein:
- the first interconnection path connects the first bonding pad to a first one of the bond fingers; and
- the second interconnection path connects the second bonding pad to the first one of the bond fingers.

15. The semiconductor package of claim 13, wherein:
- the first interconnection path connects the first bonding pad to a first one of the bond fingers; and
- the second interconnection path connects the second bonding pad to a second one of the bond fingers.

16. The semiconductor package of claim 7, wherein the conductive wire comprises thermally treated conductive nanoparticles.

17. The semiconductor package of claim 7, wherein the conductive wire comprises one or more of gold and aluminum.

18. The semiconductor package of claim 7, wherein the first molding member comprises a semisolid material including silicon.

* * * * *